United States Patent
Ahlers et al.

(10) Patent No.: US 11,183,445 B2
(45) Date of Patent: Nov. 23, 2021

(54) SEMICONDUCTOR ARRANGEMENT, LAMINATED SEMICONDUCTOR ARRANGEMENT AND METHOD FOR FABRICATING A SEMICONDUCTOR ARRANGEMENT

(71) Applicant: Infineon Technologies AG, Neubiberg (DE)

(72) Inventors: Dirk Ahlers, Munich (DE); Frank Daeche, Unterhaching (DE); Daniel Schleisser, Munich (DE); Thomas Stoek, Buxtehude (DE)

(73) Assignee: Infineon Technologies AG, Neubiberg (DE)

( * ) Notice: Subject to any disclaimer, the term of this patent is extended or adjusted under 35 U.S.C. 154(b) by 44 days.

(21) Appl. No.: 16/776,026

(22) Filed: Jan. 29, 2020

(65) Prior Publication Data

US 2020/0279799 A1 Sep. 3, 2020

(30) Foreign Application Priority Data

Feb. 28, 2019 (DE) .......................... 102019105123.1

(51) Int. Cl.
*H01L 23/495* (2006.01)
*H01L 21/48* (2006.01)
(Continued)

(52) U.S. Cl.
CPC ...... *H01L 23/49575* (2013.01); *H01L 21/486* (2013.01); *H01L 21/4821* (2013.01); *H01L 21/4825* (2013.01); *H01L 21/4857* (2013.01); *H01L 23/3107* (2013.01); *H01L 23/49527* (2013.01); *H01L 23/49537* (2013.01);
(Continued)

(58) Field of Classification Search
CPC ............... H01L 25/042; H01L 25/0655; H01L 25/0752; H01L 25/0753; H01L 25/115; H01L 23/49537; H01L 23/49575; H01L 21/4821

See application file for complete search history.

(56) References Cited

U.S. PATENT DOCUMENTS 7,772,681 B2 * 8/2010 Joshi ................. H01L 23/49562
257/668
8,283,212 B2 * 10/2012 Xue ........................ H01L 24/97
438/123

(Continued)

FOREIGN PATENT DOCUMENTS

DE 10 2013 103 085 A1 10/2013
DE 10 2015 105 821 A1 10/2015

*Primary Examiner* — David A Zarneke
(74) *Attorney, Agent, or Firm* — Harrity & Harrity, LLP

(57) ABSTRACT

A semiconductor arrangement comprises a leadframe comprising at least a first and a second carrier, the first and second carriers being arranged laterally besides each other, at least a first and a second semiconductor die, the first semiconductor die being arranged on and electrically coupled to the first carrier and the second semiconductor die being arranged on and electrically coupled to the second carrier, and an interconnection configured to mechanically fix the first carrier to the second carrier and to electrically insulate the first carrier from the second carrier, wherein the first and second semiconductor dies are at least partially exposed to the outside.

20 Claims, 4 Drawing Sheets

(51) Int. Cl.
*H01L 23/31* (2006.01)
*H01L 25/075* (2006.01)
*H01L 25/07* (2006.01)
*H01L 25/04* (2014.01)
*H01L 25/11* (2006.01)
*H01L 25/065* (2006.01)

(52) U.S. Cl.
CPC .. *H01L 23/49558* (2013.01); *H01L 23/49586* (2013.01); *H01L 25/042* (2013.01); *H01L 25/0655* (2013.01); *H01L 25/072* (2013.01); *H01L 25/0753* (2013.01); *H01L 25/115* (2013.01)

(56) References Cited

U.S. PATENT DOCUMENTS

| | | | |
|---|---|---|---|
| 8,921,874 B2 * | 12/2014 | Kobayakawa | H01L 23/4951 257/88 |
| 10,424,535 B2 * | 9/2019 | Huang | H01L 21/4839 |
| 2008/0012036 A1 * | 1/2008 | Loh | H01L 33/642 257/99 |
| 2020/0105974 A1 * | 4/2020 | Ozeki | H01L 33/44 |

\* cited by examiner

SEMICONDUCTOR ARRANGEMENT, LAMINATED SEMICONDUCTOR ARRANGEMENT AND METHOD FOR FABRICATING A SEMICONDUCTOR ARRANGEMENT

CROSS REFERENCE TO RELATED APPLICATION

This application claims priority to German Patent Application No. 102019105123.1 filed on Feb. 28, 2019, the content of which is incorporated by reference herein in its entirety.

TECHNICAL FIELD

This disclosure relates, in general, to a semiconductor arrangement, a laminated semiconductor arrangement and a method for fabricating a semiconductor arrangement.

BACKGROUND

Semiconductor device manufacturers constantly strive to improve the electrical and thermal characteristics of semiconductor devices, while also trying to improve the level of integration. One way to obtain devices with an improved level of integration is to embed semiconductor dies in a laminated body like a printed circuit board (PCB). However, semiconductor dies, in particular bare power semiconductor dies with a vertical transistor structure, may be very thin and may therefore be difficult to handle. This may be a hindrance, in particular in the fabrication of such laminated embedded devices.

SUMMARY

Improved semiconductor arrangements and improved methods of fabrication may help to overcome the above problems and other problems. Examples are described by the features of the independent claims. Further examples are described by the features of the dependent claims.

Various aspects pertain to a semiconductor arrangement, comprising: a leadframe comprising at least a first and a second carrier, the first and second carriers being arranged laterally besides each other, at least a first and a second semiconductor die, the first semiconductor die being arranged on and electrically coupled to the first carrier and the second semiconductor die being arranged on and electrically coupled to the second carrier, and an interconnection configured to mechanically fix the first carrier to the second carrier and to electrically insulate the first carrier from the second carrier, wherein the first and second semiconductor dies are at least partially exposed to the outside, and wherein the interconnection is an independent component, not an encapsulation of the semiconductor die nor a laminate layer.

Various aspects pertain to a laminated semiconductor arrangement, comprising: a leadframe comprising at least a first and a second carrier, the first and second carriers being arranged laterally besides each other, at least a first and a second semiconductor die, the first semiconductor die being arranged on and electrically coupled to the first carrier and the second semiconductor die being arranged on and electrically coupled to the second carrier, an interconnection configured to mechanically fix the first carrier to the second carrier, at least one first laminate layer arranged over the first and second semiconductor dies, and a redistribution structure arranged on the first laminate layer and configured to electrically connect the first semiconductor die to the second semiconductor die, wherein the interconnection is an independent component, not an encapsulation of the semiconductor die nor a laminate layer.

Various aspects pertain to a method for fabricating a semiconductor arrangement, the method comprising: providing a leadframe comprising at least a first and a second carrier, the first and second carriers being arranged laterally besides each other, arranging a first semiconductor die on the first carrier and electrically coupling the first semiconductor die to the first carrier, arranging a second semiconductor die on the second carrier and electrically coupling the second semiconductor die to the second carrier, and arranging an interconnection alongside the first and second carriers, the interconnection being configured to mechanically fix the first carrier to the second carrier and to electrically insulate the first carrier from the second carrier wherein the interconnection is an independent component, not an encapsulation of the semiconductor die nor a laminate layer, wherein the first and second semiconductor dies are at least partially exposed to the outside.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

To the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements.

The semiconductor die(s) described further below may be of different types, may be manufactured by different technologies and may include for example integrated electrical, electro-optical or electro-mechanical circuits and/or passives, logic integrated circuits, control circuits, microprocessors, memory devices, etc.

Figure 1A:
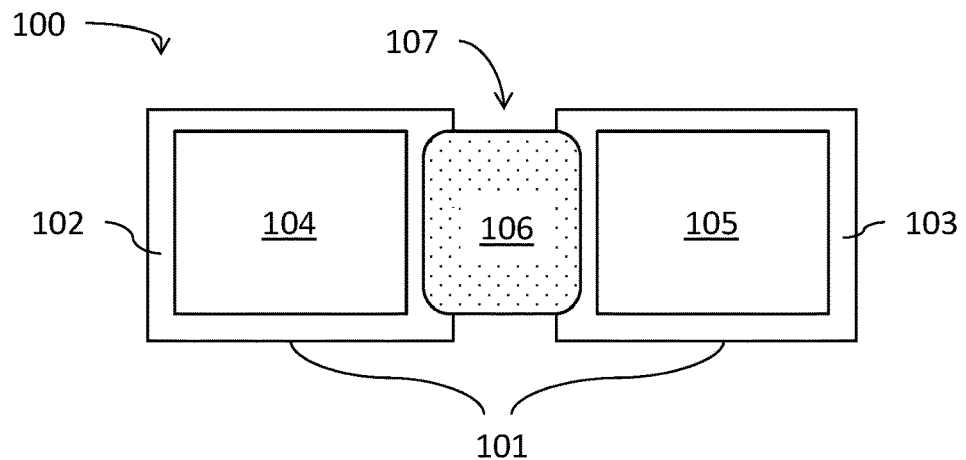
FIGS. 1A and 1B show a first example of a semiconductor arrangement that comprises an electrically insulating interconnection arranged between two carriers.

FIG. 1A shows a top down view of a semiconductor arrangement 100 comprising a leadframe 101 comprising at least a first carrier 102 and a second carrier 103. The first and second carriers 102, 103 are arranged laterally besides each other. The semiconductor arrangement 100 further comprises at least a first semiconductor die 104 and a second semiconductor die 105, the first semiconductor die 104 being arranged on and electrically coupled to the first carrier 102 and the second semiconductor die 105 being arranged on and electrically coupled to the second carrier 103. The semiconductor arrangement 100 also comprises an interconnection 106 configured to mechanically fix the first carrier 102 to the second carrier 103 and to electrically insulate the first carrier 102 from the second carrier 103. In the semiconductor arrangement 100 the first and second semiconductor dies 104, 105 are at least partially exposed to the outside. Herein, the term "partially exposed" may have the meaning that an upper main side of the semiconductor dies 104, 105 that faces away from the respective carrier 102, 103 as well as lateral sides are exposed to the outside, whereas a lower main side is covered by the respective carrier 102, 103.

The leadframe 101 may comprise or consist of a metal like Al, Cu, Fe or a metal alloy. Leadframe 101 may have a thickness t (compare FIG. 1B) in the range of 100 µm to 2 mm or in the range of 200 µm to 1 mm. Leadframe 101 may comprise an outer frame, wherein the first and second carriers 102, 103 are connected to the outer frame via tie-bars.

The first and second carriers 102, 103 may have an essentially rectangular shape and they may be essentially flat. The first and second carriers 102, 103 may be configured to provide mechanical support to the first and second semiconductor dies 104, 105. The first and second carriers may comprise one or more galvanically deposited layers (e.g. Cu layers) on a first main side facing the semiconductor dies 104, 105 and/or on an opposite second main side.

The first and second semiconductor dies 104, 105 may be power semiconductor dies configured to process a high voltage and/or a high electrical current. The semiconductor dies 104, 105 may comprise a vertical transistor structure, wherein a first electrode (e.g. a source electrode, an emitter electrode, a drain electrode or a collector electrode) faces the respective carrier 102, 103 and wherein an opposite second electrode (e.g. a source electrode, an emitter electrode, a drain electrode or a collector electrode) faces away from the respective carrier 102, 103. The semiconductor dies 104, 105 may e.g. be FETs or IGBTs. According to an example, the semiconductor dies 104, 105 are bare dies, meaning that they are not encapsulated, e.g. not encapsulated in a molded body.

The first and second semiconductor dies 104, 105 may be mechanically and electrically coupled to the first and second carriers 102, 103 by joints like solder joints or sintered joints. In the case of solder joints, a diffusion solder process may be used for example to fabricate the joints. The semiconductor dies 104, 105 may be arranged on the carriers 102, 103 by a pick-and-place process.

The interconnection 106 may be configured to mechanically interlock with interlocking structures of the first and second carriers 102, 103 in order to mechanically fix the first carrier 102 to the second carrier 103. The interconnection 106 may e.g. be clipped into the interlocking structures. Alternatively and/or additionally, the interconnection 106 may be glued to the carriers 102, 103 in order to mechanically fix the first carrier 102 to the second carrier 103.

The interconnection 106 may be a plastic preform that is arranged alongside the first and second carriers 102, 103 by a pick-and-place process. The interconnection 106 may alternatively be dispensed alongside the carriers 102, 103 in fluid form and subsequently cured, e.g. by heating. The interconnection 106 may comprise or consist of a plastic, a polymer, a molded body, a ceramic or any other suitable electrically insulating material with the required mechanical robustness to fix the first carrier 102 to the second carrier 103.

The interconnection 106 may be arranged alongside the carriers 102, 103 before or after the semiconductor dies 104, 105 are arranged on the carriers 102, 103. For example, soldering the semiconductor dies 104, 105 to the carriers 102, 103 may require the application of a certain minimum temperature, but the interconnection 106 may not be configured to withstand this minimum temperature. In this case, the interconnection 106 may be arranged alongside the carriers 102, 103 after the solder joints have been formed. In the case that the interconnection 106 can withstand the minimum temperature however, the interconnection 106 may be arranged alongside the carriers 102, 103 before the solder joints are formed.

The interconnection 106 may be a stamped part. For example, the interconnection 106 may be placed alongside the carriers 102, 103 (e.g. by dispensing or by a pick-and-place process) and a stamping process may be used to mechanically fix the interconnection 106 to the carriers 102, 103. Stamping may also help to interlock the interconnection 106 with the interlocking structures of the carriers 102, 103.

Figure 1B:
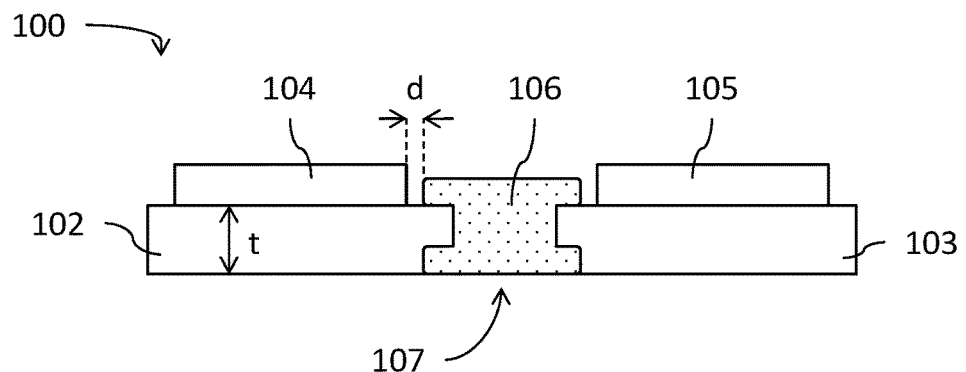

FIG. 1B shows a side view of the semiconductor arrangement 100. According to the example shown in FIG. 1B, the interconnection 106 may be arranged between the first carrier 102 and the second carrier 103. The interconnection 106 may completely or at least partially fill a space between the carriers 102, 103. In other words, the leadframe 101 may comprise an opening 107 arranged between the first and second carriers 102, 103 and the interconnection 106 may partially or completely fill the opening.

According to an example, the interconnection 106 may be coplanar or almost coplanar with the second (lower) main side of the carriers 102, 103. This may e.g. be due to the fact that the carriers 102, 103 are arranged on a support like a tape when the interconnection 106 is arranged alongside the carriers 102, 103. A top of the interconnection 106 may stick out of the opening beyond a plane comprising the first main sides of the carriers 102, 103.

The interconnection 106 may be arranged at a minimum distance d to the semiconductor dies 104, 105 (that is, the interconnection 106 may not touch the semiconductor dies 104, 105). The minimum distance d may be 100 µm or more, 200 µm or more, 500 µm or more, or 1 mm or more. The minimum distance d may be dimensioned such that a laminate or a mold may be able to fill (in particular, completely fill) the gap between the interconnection 106 and the respective semiconductor die 104, 105.

According to an example, the semiconductor arrangement 100 may comprise more than two carriers and more than two semiconductor dies. For example, the semiconductor arrangement 100 may comprise one further carrier and one further semiconductor die arranged on and electrically coupled to the further carrier. The further carrier may be arranged laterally besides the first carrier 102 (e.g. to the left in FIGS. 1A and 1B) or laterally besides the second carrier 103 (e.g. to the right in FIGS. 1A and 1B). A further interconnection 106 may configured to mechanically fix the further carrier to the first carrier 102 or to the second carrier 103, respectively.

According to an example, the first semiconductor die 104 may be arranged on the first carrier 102 "source-up" (e.g. such that the source electrode faces away from the first carrier 102), the second semiconductor die 105 may be arranged on the second carrier 103 "drain-up" and the further semiconductor die may be arranged on the further carrier "source-up".

Figure 2:
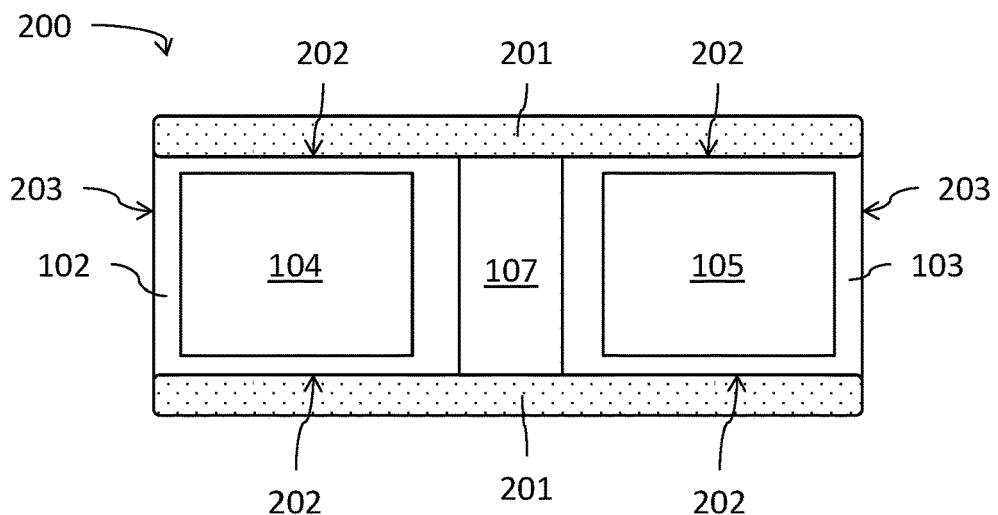
FIG. 2 shows a second example of a semiconductor arrangement that comprises an interconnection arranged alongside lateral sides of the carriers.

FIG. 2 shows a top down view of a further semiconductor arrangement 200, which may be similar or identical to the semiconductor arrangement 100, except for the differences described in the following. Like reference signs may denote similar or identical parts.

Semiconductor arrangement 200 does not comprise an interconnection 106 that is arranged between the carriers 102, 103 (e.g. in the opening 107). Instead, in semiconductor arrangement 200 interconnections 201 are arranged alongside opposite lateral sides 202 of the carriers 102, 103. Apart from the different position, the interconnections 201 may be identical to the interconnection 106 and may in particular comprise the same material and may also be put in position using the same processes as mentioned above.

The interconnections 201 may be arranged alongside the whole length of the lateral sides 202 as shown in FIG. 2. However, it is also possible that the interconnections 201 are arranged alongside only a part of the length of the lateral sides 202.

According to an example, the interconnections 201 may be arranged alongside the lateral sides 202 and also in the opening 107 (that is, the interconnections 201 may surround the carriers 102, 103 at least partially on three sides). According to yet another example, the interconnections 201 may additionally be arranged alongside the exterior sides 203 of the carriers 102, 103 (that is, the interconnections 201 may surround the carriers 102, 103 at least partially on four sides).

Figure 3A:
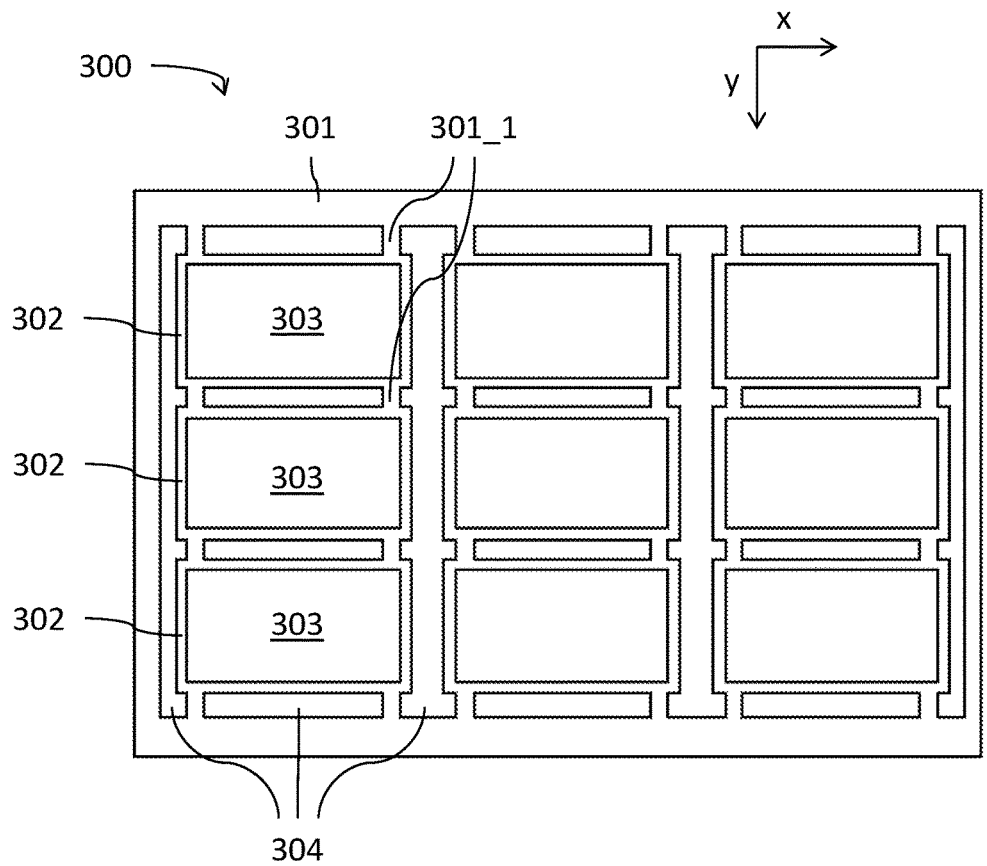
FIGS. 3A and 3B show a third and a fourth example of a semiconductor arrangement before the application of interconnections (FIG. 3A) and after interconnections have been applied (FIG. 3B).

FIG. 3A shows a top down view of a further semiconductor arrangement 300, which may be similar or identical to the semiconductor arrangements 100 and 200, except for the differences described in the following. Like reference signs may denote similar or identical parts.

The semiconductor arrangement 300 comprises leadframe 301 that may be identical to leadframe 101. Leadframe 301 comprises a multitude of carriers 302, which may be identical to the carriers 102 and 103. A semiconductor die 303 may be arranged on each one of the carriers 302, wherein the semiconductor dies 303 may be identical to the semiconductor dies 104, 105.

The leadframe 301 also comprises a multitude of openings 304 that separate the individual carriers from one another. Tie-bars 301_1 may span the openings 304 and connect selected ones of the carriers 302 with one another. For example, carriers 302 arranged consecutively along the y-direction may be connected by tie-bars, whereas no tie-bars may connect carriers 302 along the y-direction.

Figure 3B:
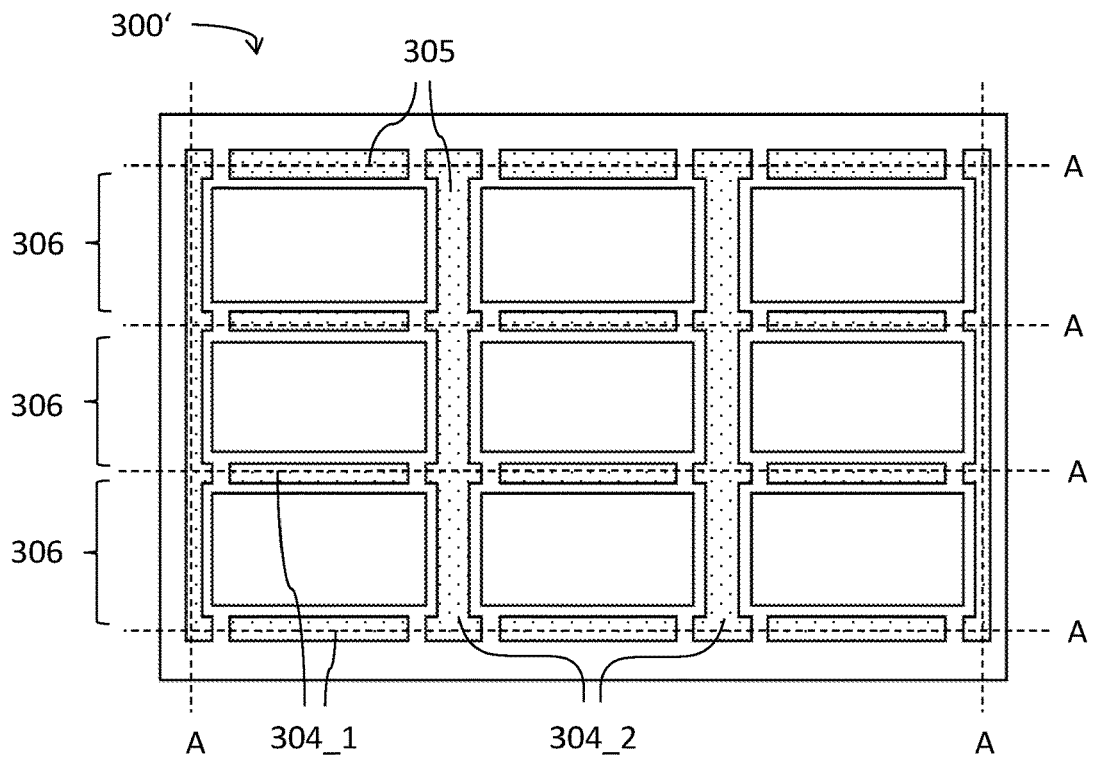

FIG. 3B shows a semiconductor arrangement 300' which may be identical to the semiconductor arrangement 300 except that semiconductor arrangement 300' also comprises interconnections 305 arranged alongside the carriers 302. The interconnections 305 may be arranged in the openings 304 and they may completely or at least partially fill the openings 304. The interconnections 305 may be identical to the interconnection 106 of semiconductor arrangement 100 or to the interconnections 201 of semiconductor arrangement 200.

The interconnections 305 may be arranged in all of the openings 304 as shown in FIG. 3B or the interconnections 305 may be arranged in only some of the openings 304. For example, interconnections 305 may only be arranged in a first group of openings 304_1 that basically extend along the x-direction. According to another example, interconnections 305 may only be arranged in a second group of openings 304_2 that basically extend along the y-direction.

In the semiconductor arrangement 300' individual carriers 302 are still mechanically and electrically connected to one another by the tie-bars 301_1. In order to fabricate a semiconductor arrangement like the semiconductor arrangements 100 or 200, wherein all carriers are electrically insulated from one another, the semiconductor arrangement 300' may be cut along cutting lines A. The cutting lines A extend along at least some of the openings 304. By cutting along the cutting lines, semiconductor arrangements 306 comprising electrically insulated carriers can be obtained.

According to an example, the semiconductor arrangements 306 may each comprise three carriers 302 and three semiconductor dies 303, which may e.g. be bare dies. In this stadium of fabrication, the semiconductor arrangements 306 may be placed onto a testing equipment, e.g. for electrical testing of the semiconductor dies 303. Compared to testing single semiconductor dies, such a "bulk testing" of semiconductor arrangements 306 may be more cost efficient. Furthermore, the semiconductor arrangements 306 may be mechanically more stable than single (bare) dies and may therefore be easier to handle.

Figure 4A:
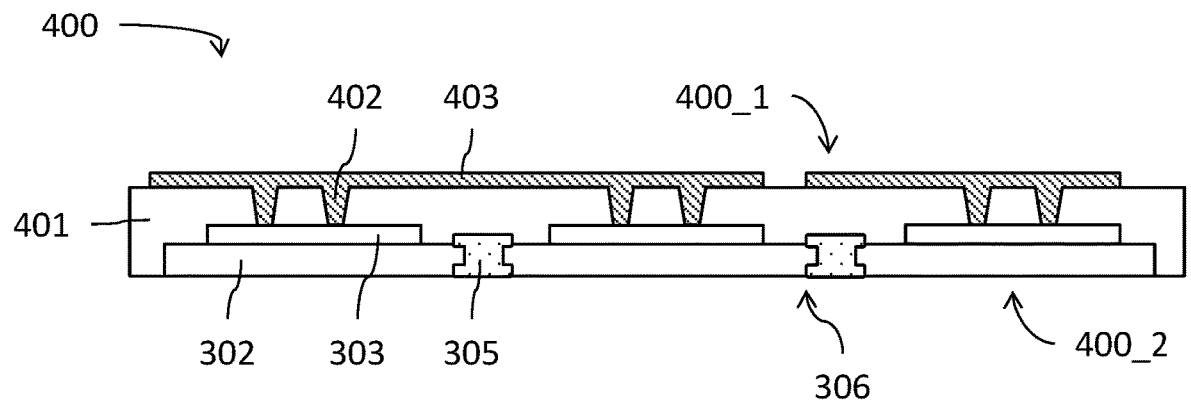
FIGS. 4A and 4B show a first and a second example of a laminated semiconductor arrangement that comprises an electrically insulating interconnection.

FIG. 4A shows a side view of a laminated semiconductor arrangement 400 comprising a semiconductor arrangement 300 that is at least partially encapsulated in a laminate 401. According to an example, the laminate 401 comprises or consists of a PCB and the semiconductor arrangement 300 is embedded in the PCB.

Compared to embedding individual semiconductor dies in the laminate 401, embedding the semiconductor arrangement 300 instead may offer certain advantages. Note that the interconnects 106,201,305 are not an encapsulant or a laminate layer, and may instead be provided at an earlier stage of the method than encapsulating or laminating the semiconductor arrangement 300, which in some implementations allows for improved ease of manufacture. For example, using the semiconductor arrangement 300 it is possible to embed several semiconductor dies (e.g. two or three or more) simultaneously in the laminate 401 (for example, the semiconductor arrangement 300 comprising several semiconductor dies may be put into position by a single pick-and-place process). Furthermore, using the semiconductor arrangement 300 the mechanical robustness of the semiconductor dies 303 is increased because the (thin) semiconductor dies 303 are reinforced by the carriers 302.

The laminated semiconductor arrangement 400 may comprise vias 402 which electrically connect the semiconductor dies 303 with a redistribution layer 403. The laminate 401 may comprise a single laminate material layer or it may comprise several stacked laminate material layers. The laminated semiconductor arrangement 400 may also comprise more than one single redistribution layer 403, for example several stacked redistribution layers 403. The semiconductor arrangement 400 may comprise additional electric or electronic components which may be arranged on the first main side 400_1 or on the second main side 400_2. The additional electric or electronic components may for example comprise resistors, capacitors, inductors or semiconductor dies (e.g. comprising logic circuitry configured to control the semiconductor dies 303).

Figure 4B:
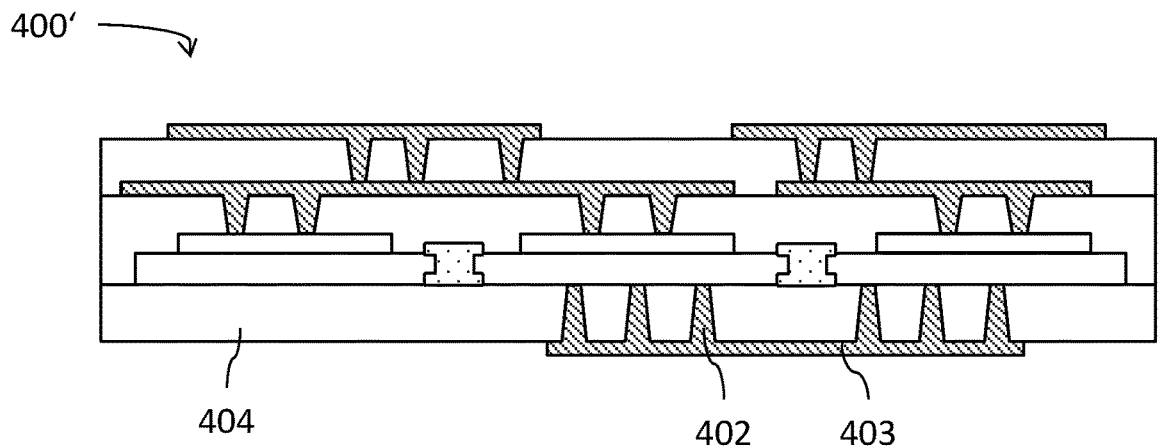

FIG. 4B shows a side view of a further laminated semiconductor arrangement 400', which may be identical to the laminated semiconductor arrangement 400 except for the differences described in the following.

With respect to laminated semiconductor arrangement 400 it is shown that the carriers 302 are exposed on the second main side 400_2. However, it is also possible that one or more further laminate material layers 404 are arranged on the second main side 400_2 and completely encapsulate the carriers 302. Further vias 402 and one or more further (stacked) redistribution structures 403 may also be arranged on the further laminate material layer 404.

According to an example, fabricating the laminated semiconductor arrangement 400' may comprise providing the further laminate material layer 404, placing the semiconductor arrangement 300 onto the further laminate material layer 404, placing one or more additional laminate material layers over the semiconductor arrangement 300 and applying heat and/or pressure.

Figure 5:
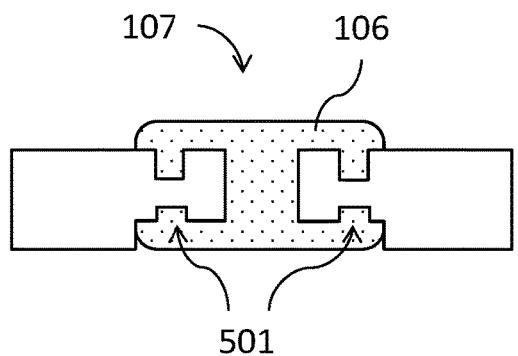
FIG. 5 shows an example of the interconnection element of FIG. 1B in greater detail.

FIG. 5 shows a detail view of one example for the opening 107 shown in FIG. 1B. In the example of FIG. 5 the first and second carriers 102, 103 comprise interlocking structures 501 in the form of recesses in the upper and lower main sides of the carriers 102, 103. These recesses are configured such that the interconnection 106 can extend into the recesses and thereby mechanically fix the first carrier 102 to the second carrier 103. Of course, other forms of interlocking structures are contemplated as well.

Figure 6:
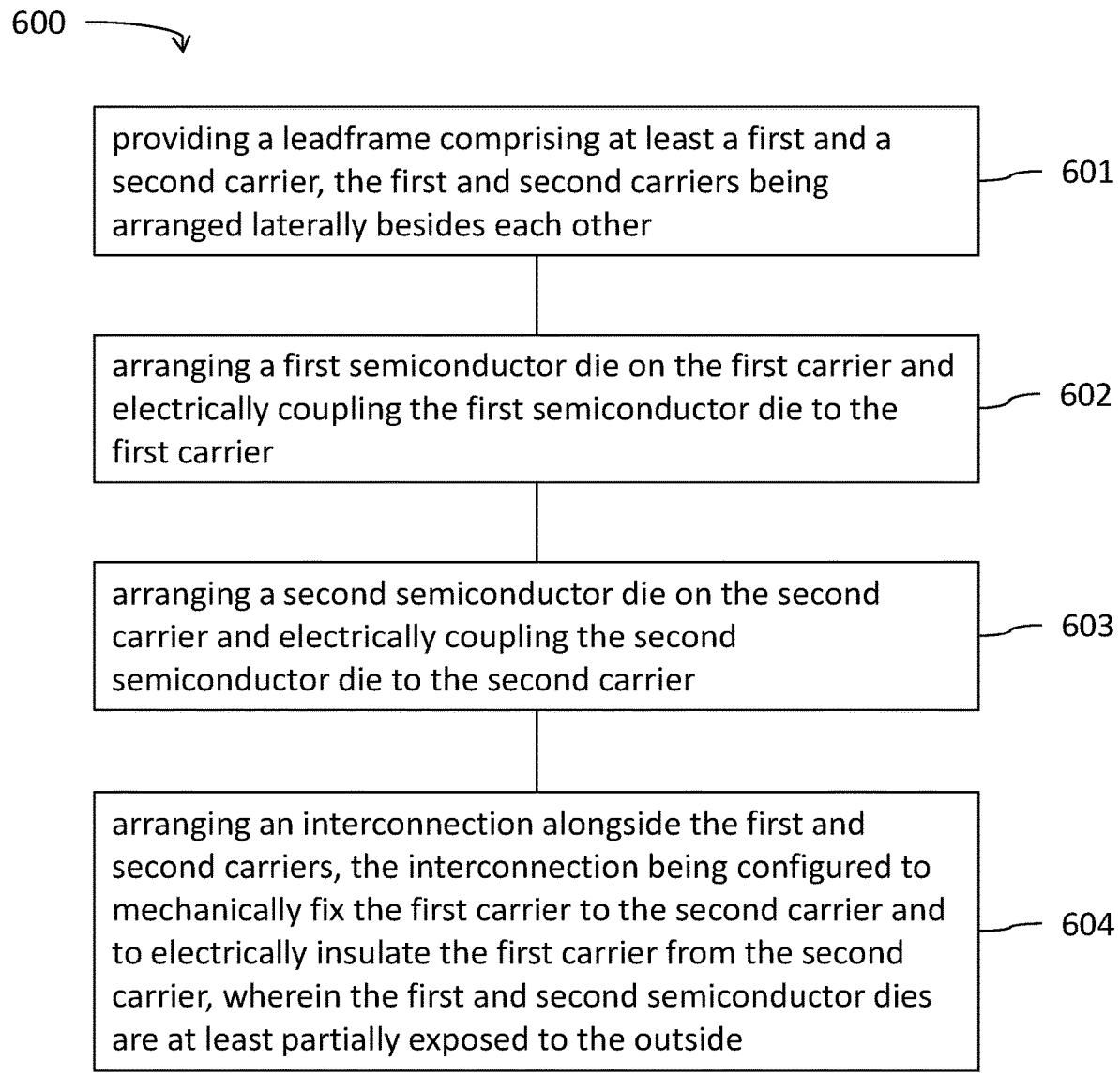
FIG. 6 shows a flow chart of a method for fabricating a semiconductor arrangement or a laminated semiconductor arrangement.

FIG. 6 is a flow chart of a method 600 for fabricating a semiconductor arrangement like the semiconductor arrangements 100, 200, 300 and 300' or for fabricating a laminated semiconductor arrangement like the laminated semiconductor arrangements 400 and 400'.

Method 600 comprises at 601 an act of providing a leadframe comprising at least a first and a second carrier, the first and second carriers being arranged laterally besides each other, at 602 an act of arranging a first semiconductor die on the first carrier and electrically coupling the first semiconductor die to the first carrier, at 603 an act of arranging a second semiconductor die on the second carrier and electrically coupling the second semiconductor die to the second carrier, and at 604 an act of arranging an interconnection alongside the first and second carriers, the interconnection being configured to mechanically fix the first carrier to the second carrier and to electrically insulate the first carrier from the second carrier, wherein the first and second semiconductor dies are at least partially exposed to the outside.

According to an example, method 600 may further comprise fabricating an opening in the leadframe between the first and second carriers and arranging the interconnection in the opening. Furthermore, the interconnection may be subjected to a stamping process (e.g. to firmly stamp the interconnection into the opening) to fix the first and second carriers together.

According to an example, method 600 may be used to fabricate a laminated semiconductor arrangement. In this case, method 600 may further comprise an act of laminating over the first and second carriers, the first and second semiconductor dies and the interconnection to fabricate a laminated body. Furthermore, electrical connections may be fabricated in the laminated body to electrically couple the first semiconductor die to the second semiconductor die. The semiconductor dies may for example be connected such that they are part of a half-bridge circuit.

EXAMPLES

In the following, the semiconductor arrangement, the laminated semiconductor arrangement and the method for fabricating a semiconductor arrangement are further explained using specific examples.

Example 1 is a semiconductor arrangement, comprising: a leadframe comprising at least a first and a second carrier, the first and second carriers being arranged laterally besides each other, at least a first and a second semiconductor die, the first semiconductor die being arranged on and electrically coupled to the first carrier and the second semiconductor die being arranged on and electrically coupled to the second carrier, and an interconnection configured to mechanically fix the first carrier to the second carrier and to electrically insulate the first carrier from the second carrier, wherein the first and second semiconductor dies are at least partially exposed to the outside and wherein the interconnection is an independent component, not an encapsulation of the semiconductor die nor a laminate layer.

Example 2 is the semiconductor arrangement of example 1, wherein the first and second carriers comprise interlocking structures and wherein the interconnection interlocks with the interlocking structures.

Example 3 is the semiconductor arrangement of example 1 or 2, wherein the leadframe comprises an opening between the first and second carriers and wherein the interconnection is arranged in the opening.

Example 4 is the semiconductor arrangement of example 3, wherein the interconnection completely fills the opening.

Example 5 is the semiconductor arrangement of example 3 or 4, wherein the interconnection is a stamped part.

Example 6 is the semiconductor arrangement of one of the preceding examples, wherein the interconnection is a plastic preform.

Example 7 is the semiconductor arrangement of one of the preceding examples, wherein a drain electrode of the first semiconductor die faces the first carrier and a source electrode of the second semiconductor die faces the second carrier, or wherein a collector electrode of the first semiconductor die faces the first carrier and an emitter electrode of the second semiconductor die faces the second carrier.

Example 8 is a laminated semiconductor arrangement, comprising: a leadframe comprising at least a first and a second carrier, the first and second carriers being arranged laterally besides each other, at least a first and a second semiconductor die, the first semiconductor die being arranged on and electrically coupled to the first carrier and the second semiconductor die being arranged on and electrically coupled to the second carrier, an interconnection configured to mechanically fix the first carrier to the second carrier, at least one first laminate layer arranged over the first and second semiconductor dies, and a redistribution structure arranged on the first laminate layer and configured to electrically connect the first semiconductor die to the second semiconductor die, wherein the interconnection is an independent component, not an encapsulation of the semiconductor die nor a laminate layer.

Example 9 is the laminated semiconductor arrangement of example 8, further comprising: at least one further laminate layer, the further laminate layer being arranged below the first and second carriers.

Example 10 is the laminated semiconductor arrangement of example 8 or 9, wherein the first and second carriers and the first and second semiconductor dies are completely encapsulated in laminate.

Example 11 is the laminated semiconductor arrangement of one of examples 8 to 10, further comprising: vias reaching through the first laminate layer, the vias being coupled to the first and second semiconductor dies.

Example 12 is a method for fabricating a semiconductor arrangement, the method comprising: providing a leadframe comprising at least a first and a second carrier, the first and second carriers being arranged laterally besides each other, arranging a first semiconductor die on the first carrier and electrically coupling the first semiconductor die to the first carrier, arranging a second semiconductor die on the second carrier and electrically coupling the second semiconductor die to the second carrier, and arranging an interconnection alongside the first and second carriers, the interconnection being configured to mechanically fix the first carrier to the second carrier and to electrically insulate the first carrier from the second carrier wherein the interconnection is an independent component, not an encapsulation of the semiconductor die nor a laminate layer, wherein the first and second semiconductor dies are at least partially exposed to the outside.

Example 13 is the method of example 12 further comprising: fabricating an opening in the leadframe between the first and second carriers, and arranging the interconnection in the opening.

Example 14 is the method of example 12 or 13 further comprising: stamping the interconnection to fix the first and second carriers together.

Example 15 is the method of one of examples 12 to 14 further comprising: laminating over the first and second carriers, the first and second semiconductor dies and the interconnection to fabricate a laminated body.

Example 16 is the method of example 15 further comprising: fabricating electrical connections in the laminated body to electrically couple the first semiconductor die to the second semiconductor die.

Example 17 is the method of example 16, wherein the first and second semiconductor dies are part of a half-bridge circuit.

Example 18 is an apparatus comprising means for performing a method according to one of examples 12 to 17.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated example implementations of the disclosure.

What is claimed is:

1. A semiconductor arrangement, comprising:
a leadframe comprising at least a first carrier and a second carrier, the first carrier and the second carrier being arranged laterally besides each other;
at least a first semiconductor die and a second semiconductor die, the first semiconductor die being arranged on and electrically coupled to the first carrier, and the second semiconductor die being arranged on and electrically coupled to the second carrier; and
an interconnection configured to mechanically fix the first carrier to the second carrier and to electrically insulate the first carrier from the second carrier,
wherein the first semiconductor die and the second semiconductor die are at least partially exposed to an outside of the semiconductor arrangement, and
wherein the interconnection is an independent component of the semiconductor arrangement, not an encapsulation of the first semiconductor die or the second semiconductor die and not a laminate layer.

2. The semiconductor arrangement of claim 1, wherein the first carrier and the second carrier comprise interlocking structures, and wherein the interconnection interlocks with the interlocking structures.

3. The semiconductor arrangement of claim 1, wherein the leadframe comprises an opening between the first carrier and the second carrier, and wherein the interconnection is arranged in the opening.

4. The semiconductor arrangement of claim 3, wherein the interconnection completely fills the opening.

5. The semiconductor arrangement of claim 1, wherein the interconnection is a stamped part.

6. The semiconductor arrangement of claim 1, wherein the interconnection is a plastic preform.

7. The semiconductor arrangement of claim 1, wherein a drain electrode of the first semiconductor die faces the first carrier and a source electrode of the second semiconductor die faces the second carrier, or wherein a collector electrode of the first semiconductor die faces the first carrier and an emitter electrode of the second semiconductor die faces the second carrier.

8. A laminated semiconductor arrangement, comprising:
a leadframe comprising at least a first carrier and a second carrier, the first carrier and the second carrier being arranged laterally besides each other;
at least a first semiconductor die and a second semiconductor die, the first semiconductor die being arranged on and electrically coupled to the first carrier and the second semiconductor die being arranged on and electrically coupled to the second carrier;
an interconnection configured to mechanically fix the first carrier to the second carrier;
at least one first laminate layer arranged over the first semiconductor die and the second semiconductor die; and
a redistribution structure arranged on the at least one first laminate layer and configured to electrically connect the first semiconductor die to the second semiconductor die,
wherein the interconnection is an independent component of the laminated semiconductor arrangement not an encapsulation of the first semiconductor die or the second semiconductor die and not a second laminate layer.

9. The laminated semiconductor arrangement of claim 8, further comprising:
at least one third laminate layer, the at least one third laminate layer being arranged below the first carrier and the second carrier.

10. The laminated semiconductor arrangement of claim 8, wherein the first carrier, the second carrier, the first semiconductor die, and the second semiconductor die are completely encapsulated in laminate.

11. The laminated semiconductor arrangement of claim 8, further comprising:
vias reaching through the at least one first laminate layer, the vias being coupled to the first semiconductor die and the second semiconductor die.

12. A method for fabricating a semiconductor arrangement, the method comprising:
providing a leadframe comprising at least a first carrier and a second carrier, the first carrier and the second carrier being arranged laterally besides each other;
arranging a first semiconductor die on the first carrier and electrically coupling the first semiconductor die to the first carrier;
arranging a second semiconductor die on the second carrier and electrically coupling the second semiconductor die to the second carrier; and
arranging an interconnection alongside the first carrier and the second carrier, the interconnection being configured to mechanically fix the first carrier to the second carrier and to electrically insulate the first carrier from the second carrier,
wherein the interconnection is an independent component of the semiconductor arrangement, not an encapsulation of the first semiconductor die or the second semiconductor die and not a laminate layer, and
wherein the first semiconductor die and the second semiconductor die are at least partially exposed to an outside of the semiconductor arrangement.

13. The method of claim 12, further comprising:
fabricating an opening in the leadframe between the first carrier and the second carrier; and
arranging the interconnection in the opening.

14. The method of claim 12, further comprising:
stamping the interconnection to fix the first carrier and the second carrier together.

15. The method of claim 12, further comprising:
laminating over the first carrier, the second carrier, the first semiconductor die, the second semiconductor die, and the interconnection to fabricate a laminated body.

16. The method of claim 15, further comprising:
fabricating electrical connections in the laminated body to electrically couple the first semiconductor die to the second semiconductor die.

17. The method of claim 16, wherein the first semiconductor die and the second semiconductor die are part of a half-bridge circuit.

18. The method of claim 12, further comprising:
forming at least one second laminate layer, the at least one second laminate layer being arranged over the first semiconductor die and the second semiconductor die.

19. The method of claim 18, further comprising:
forming vias reaching through the at least one second laminate layer, the vias being coupled to the first semiconductor die and the second semiconductor die.

20. The method of claim 12, wherein a drain electrode of the first semiconductor die faces the first carrier and a source electrode of the second semiconductor die faces the second carrier, or wherein a collector electrode of the first semiconductor die faces the first carrier and an emitter electrode of the second semiconductor die faces the second carrier.

* * * * *